United States Patent [19]

Batz

[11] 3,815,126

[45] June 4, 1974

[54] SHAFT ENCODER FOR APPARATUS HAVING LUMINOUS PHOSPHOR SOURCE

[75] Inventor: James E. Batz, Northbrook, Ill.

[73] Assignee: Northern Illinois Gas Company, Aurora, Ill.

[22] Filed: Mar. 1, 1971

[21] Appl. No.: 119,588

[52] U.S. Cl. .......... 340/347 P, 250/71 R

[51] Int. Cl. .......... G08c 9/06, H01j 1/62

[58] Field of Search ... 340/347 P; 250/71 R, 106 R, 250/106 S, 219 DD

[56] References Cited

UNITED STATES PATENTS

| | | | |
|---|---|---|---|
| 2,975,409 | 3/1961 | Petherick | 340/347 P |
| 3,046,534 | 7/1962 | Constant | 340/347 P |
| 3,303,490 | 2/1967 | Keats | 340/347 P |
| 3,478,209 | 11/1969 | Fever | 340/71 R |
| 3,478,346 | 11/1969 | Naruyiko | 340/347 P |
| 3,534,361 | 10/1970 | Foley et al. | 340/347 P |
| 3,578,972 | 5/1971 | Dooley et al. | 250/77 |
| 3,614,774 | 10/1971 | Clements | 340/347 P |

*Primary Examiner*—Thomas J. Sloyan
*Attorney, Agent, or Firm*—Johnson, Dienner, Emrich, Verbeck & Wagner

[57] ABSTRACT

An analog-to-digital converter for converting angular positional information of a shaft associated with a meter dial register into binary coded outputs includes a non-contacting encoder having a code member with a plurality of photo resistive sense elements and a luminous phosphor source mounted for rotation by the shaft in enabling relationship with the code member providing radiant energy for energizing the sense elements selectively as the source rotates with the shaft relative to the sense elements to provide coded output signals representing ten digit positions and ten interdigital positions of the shaft; output decoding circuits provide round off of interdigital position codes and convert the coded signals to a two-out-of-five code.

16 Claims, 13 Drawing Figures

INVENTOR
JAMES E. BATZ

BY Johnson Dienner Emrich Verbeck & Wagner
ATTYS.

PATENTED JUN 4 1974
3,815,126
SHEET 2 OF 6
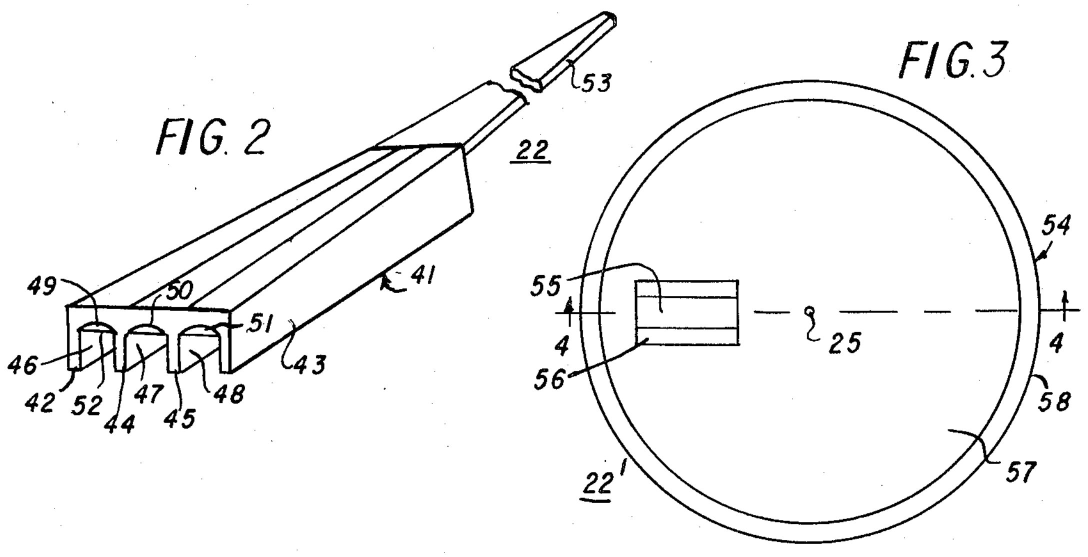
FIG. 2, FIG. 3
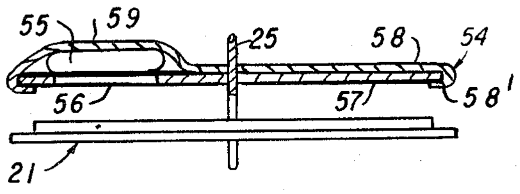
FIG. 4
FIG. 6
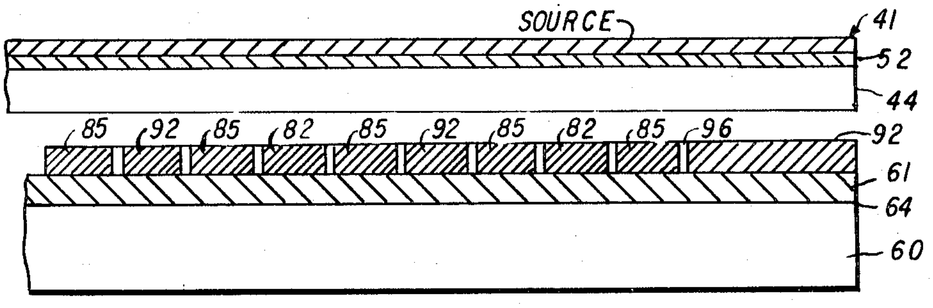
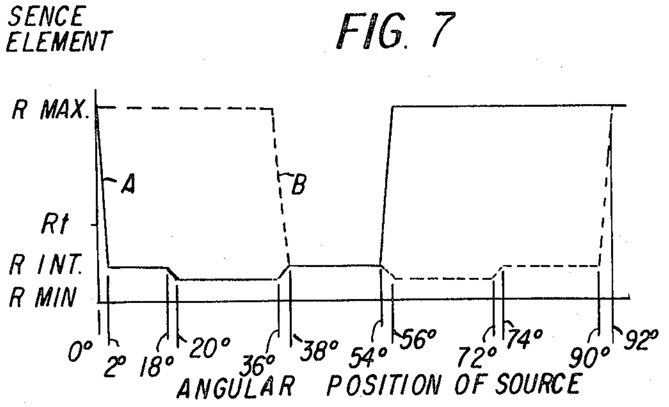
INVENTOR
JAMES E. BATZ
BY Johnson, Dienner, Emrich, Verbeck & Wagner
ATTYS.

INVENTOR
JAMES E. BATZ

BY Johnson Dienner Emrich Verbeck & Wagner
ATTYS.

INVENTOR
JAMES E. BATZ

BY Johnson Dienner Emrich Verbeck & Wagner
ATTYS.

INVENTOR
JAMES E. BATZ

BY Johnson Dienner Emrich Verbeck & Wagner
ATTYS.

INVENTOR
JAMES E. BATZ

BY Johnson Dienner Emrich Verbeck & Wagner
ATTYS.

SHAFT ENCODER FOR APPARATUS HAVING LUMINOUS PHOSPHOR SOURCE

RELATED APPLICATION

Copending application U.S. Ser. No. 119,589 of Dennis J. Martell, filed concurrently with the present application, discloses and claims the round off circuits for shaft encoder apparatus that are disclosed in the present application.

BACKGROUND OF THE INVENTION

1. Field of the Invention

This invention relates to analog-to-digital converters and, more particularly to a non-contacting type optical encoder for such converters which employs a luminous phosphor source.

2. Description of the Prior Art

Non-contacting type shaft encoders of the prior art for converting positional information of a shaft into digital signals representing the shaft position generally comprise optical encoders employing a code disc mounted on and rotatable with a shaft whose angular position is to be measured. One type of code disc has a plurality of annular concentric information channels or tracks of alternating clear and opaque areas disposed in a predetermined coded pattern. The shaft mounted code disc is interposed between a light source and a bank of photocells to permit selective energization of the photocells by light from the source as a function of the angular position of the shaft. The energized photocells provide inputs to threshold amplifiers which, in turn, provide binary coded outputs representing the angular position of the shaft.

These optical encoders require complex optical systems employing collimating lenses for directing the light from a source through the clear areas of the code disc to the photocells to selectively energize the photocells as the code disc rotates with the shaft provoding outputs representing shaft positions as the code disc rotates with the shaft. In such encoders, the transition from a turned on state to a turned off state for a photocell and vice-versa is critical to the accuracy of the coded outputs which provide positional information for the shaft.

Moreover, to provide unambiguous coding for a predetermined number of shaft positions, the code discs have comprised complex code patterns in multi-track configurations, and such coding arrangements have required sophisticated output signal detecting and decoding circuits.

SUMMARY OF THE INVENTION

The present invention provides an analog-to-digital converter employing a non-contacting encoder which has a luminous phosphor source for providing radiant energy for selectively energizing sense elements of an associated code member as a function of the angular position of the shaft to provide coded outputs representing predetermined positions of the shaft.

The radiant energy source comprises a phosphor and a radioactive element carried by a suitable support member mounted to the shaft. The phosphor is stimulated by the radioactive element causing the phosphor to emit light that is detectable by the sense elements which comprise the code member. The code member is mounted stationary, and the radiant energy source is mounted for rotation by the shaft in enabling relationship with the code member so that light radiated from the source is directed towards the code member to energize the sense elements of the code member that are adjacent the source as the source rotates with the shaft.

The code member has a plurality of discrete areas, each of which represents a predetermined position of the shaft, and regions intermediate each pair of adjacent areas. Each of the discrete areas of the code member includes a photosensitive sense element for representing a corresponding one of the predetermined shaft positions.

As the shaft rotates, the source is moved relative to the code member, energizing one of the sense elements whenever the shaft is at one of the predetermined positions and energizing an adjacent pair of sense elements whenever the shaft is intermediate a pair of the predetermined positions. The photosensitive sense elements are responsive to light from the source to change their respective electrical characteristics, such changes being detectable by detecting circuits associated with the encoder. The configuration of the sense elements is chosen to provide a maximum change for a given light source output level such that the intensity of the source output can be minimum for sense elements of a given size.

The sense elements provide a first output when energized, and a second output when unenergized. Accordingly, as the shaft rotates the source to selectively energize the sense elements, a plurality of sets of output signals representing different shaft positions are provided by the detecting circuits.

The non-contacting encoder provided by the present invention is of simple construction and forms a small compact assembly. The luminous phosphor source is self-energizing and the detecting circuits associated with the encoder employ low current field-effect devices which can be energized from a small D.C. battery as part of the encoder assembly thereby obviating the need for external power for operating the encoder. Moreover, the luminous phosphor source has a longer operating lifetime than do incandescent sources which heretofore have been used in shaft encoders employing photosensitive detecting means.

Such characteristics make the encoder provided by the present invention practical for application in remote meter readout systems for providing coded output signals representing information such as a reading of a mechanical counter of a multi-dial register of a utility meter.

It is pointed out that the operation of mechanical counters or utility meter registers is characterized by slow speed rotation of associated indicator shafts. Accordingly, converters having optical encoders for converting the angular positions of such shafts to digital coded outputs may employ inexpensive photoresistors as the photosensitive sense elements of the encoder, since the response time of the sense elements is not a critical factor in the resolution of shaft positions in such applications. Moreover the use of photoresistive sense elements simplifies manufacturing of the code member and provides a corresponding decrease in the cost of the code member.

Other advantages and features of the novel non-contacting shaft encoder provided by the present invention will be apparent from the detailed description of the encoder which follows:

DESCRIPTION OF THE DRAWINGS

FIG. 2 is an isometric view of the source of the encoder of FIG. 1;

FIG. 3 is a plan view of a second embodiment for a source for the encoder of FIG. 1;

FIG. 4 is a sectional view of the source through line 4—4 of FIG. 3;

FIG. 6 is a side sectional view of a portion of the code member of FIG. 5 taken along line 6—6 of FIG. 5;

FIG. 7 is a graphical representation of the change in resistance of the photoresistive sense elements of the code member shown in FIG. 5 versus angular positions of the source for indicating the detection threshold for the output circuits of the converter;

DESCRIPTION OF PREFERRED EMBODIMENTS

Figure 1:
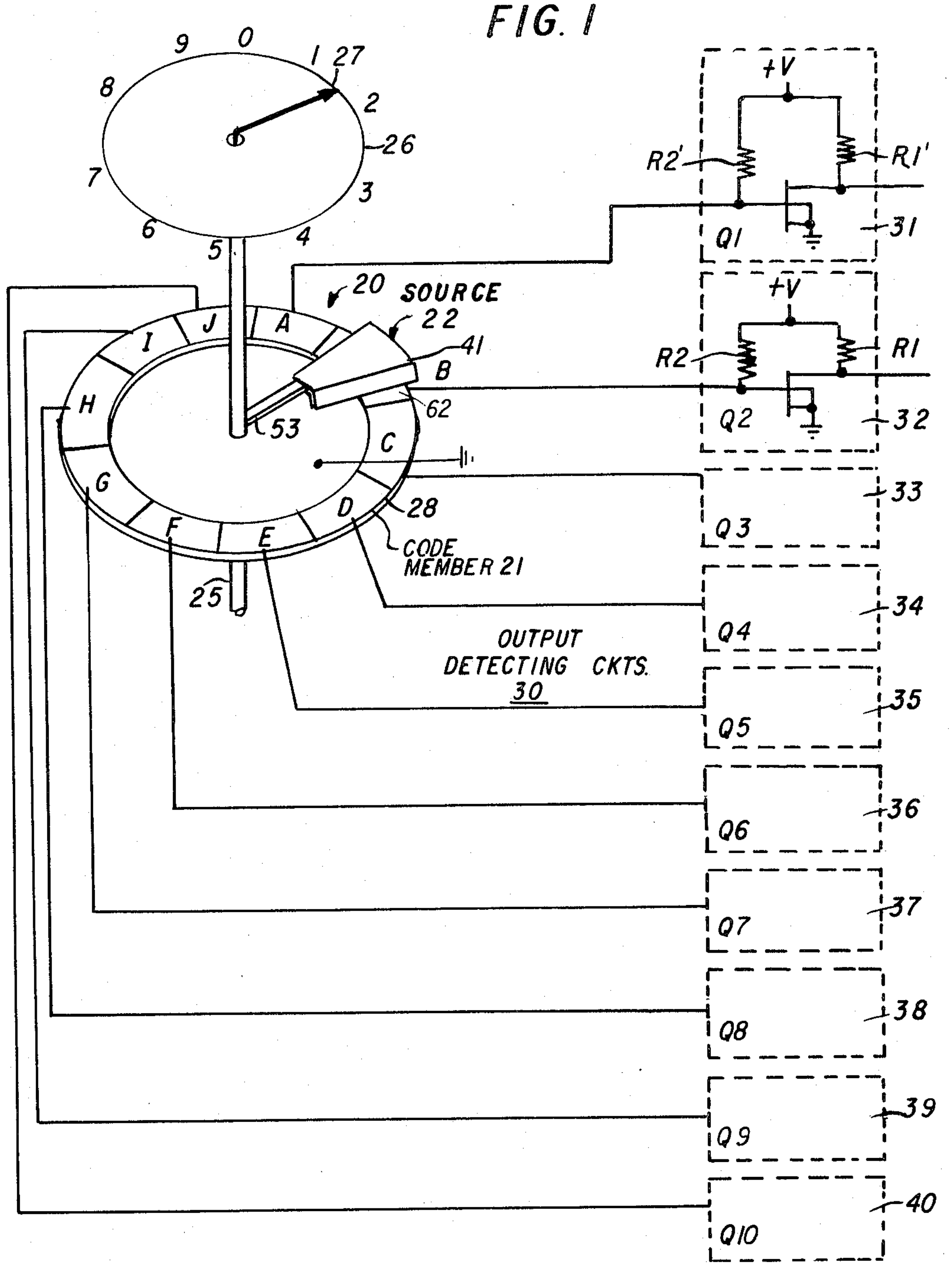
FIG. 1 is a schematic diagram of an analog-to-digital converter employing a shaft encoder having a luminous phosphor source as provided by the present invention.

A schematic representation of an analog-to-digital converter provided by the present invention is shown in FIG. 1. The converter employs a non-contacting type encoder 20 for converting angular positions of a shaft 25 into binary coded output signals which are provided over output detecting circuits 30. The shaft 25 may, for example, be part of a register of a utility meter having a plurality of dials, such as dial 26, shown in FIG. 1, for indicating measured amounts of a commodity used. In one such application, each dial, such as dial 26, has 10 digits 0–9 circumferentially spaced about the dial 26, and a pointer 27 carried by the shaft 25 for providing a visual indication of the angular position of the shaft 25 to thereby indicate a measured quantity.

The encoder assembly 20 includes a code member 21 having ten sense elements A–J disposed about the periphery of a disc shaped substrate 28, and a source 22 of radiant energy mounted for rotation with the shaft 25 in a spaced overlying relationship with the code member 21. The source 22 directs radiant energy towards the code member 21, selectively energizing the sense elements A–J as the shaft 25 rotates, moving the source 22 over the sense elements A–J in enabling relationship thereto.

Radiant Energy Source

Referring to FIG. 2, in one embodiment the radiant energy source 22 comprises a hollow, rectangular box-like structure 41 of an opaque metal or plastic material having a pair of side walls 42 and 43 and intermediate baffles 44 and 45 defining longitudinal channels 46, 47 and 48 in the structure 41. The channels 46–48 have surfaces 49–51, respectively, coated with a luminescent material 52 which comprises of a compound in powder form including a phosphor and a radioactive isotope, such as tritium, which is applied to the surfaces 49–51 of the structure 41 by a suitable adhesive. The radioactive material stimulates the phosphor causing light energy to be emitted from the source 22.

The opaque walls of the channels 46–48 define an enabling zone for the sense elements and serve to direct the light energy radiated from the source material 52 towards the portion of the code member 21 immediately underlying the source structure 41. It is pointed out that when assembled, the encoder is enclosed in a light tight housing (not shown) to prevent energization of the sense elements of the code member by ambient light.

As shown in FIG. 1, the source structure 41 is cantilever mounted to the shaft 25 by a supporting member 53 and extends parallel to the code member 21 with the radiant energy material 52 overlying the sense element portion of the code member 21.

A plan view of an alternative embodiment for a radiant energy source 22' is shown in FIG. 3. The source 22' comprises a disc-shaped support 54 mounted on the shaft 25 for rotation therewith in overlying relationship with the code member 21 as shown in FIG. 4. The support 54 encloses a transparent glass tube or capsule 55 having its inner surface coated with phosphor. The capsule 55 contains a radioactive element, such as tritium, in gaseous form for energizing the phosphor which coats the inner surface of the capsule 55 causing the phosphor to emit light for energizing the sense elements that are adjacent an opening 56 of the support member 54 as the source is rotated by the shaft 25. Encapsulation of the radioactive element simplifies manufacturing of source 22' since the radioactive gas can be sealed in the capsule at one location, and the source capsule can then be assembled with the support 54 under normal manufacturing conditions.

As shown in sectional view of FIG. 4, the support 54 comprises a flat base 57 which supports the capsule 55 adjacent the aperture 56 and a cover member 58 having an edge 58' folded over the base 57. The cover member 58 provides a chamber 59 for locating the capsule 55 relative to the aperture 56 in the base 57. The aperture 56 in the base 57 defines an enabling zone for the sense element of the code member 21 such that light energy radiated from the source is directed towards the portion of the code member 21 immediately underlying the source structure 54.

Code Member

Figure 5:
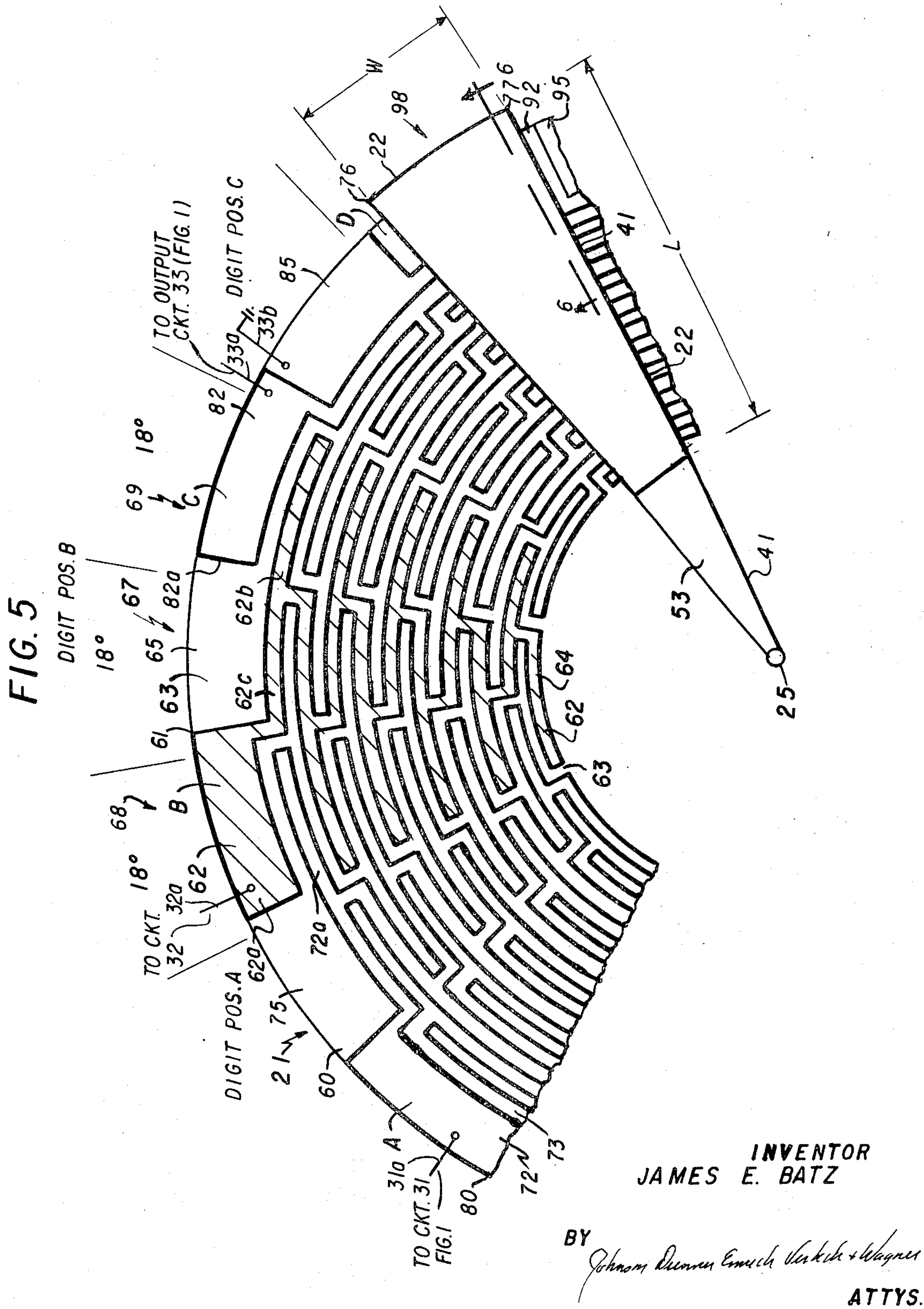
FIG. 5 is a plan view of a portion of one embodiment for the code member of the encoder shown in FIG. 1.

In one embodiment of the code member 21 the ten sense elements A–J have the configuration of the sense element B shown in FIG. 5, a plan view of a portion of a code member 21. Each sense element, such as sense element B, includes a pair of conductors 62 and 63 disposed on a surface of a disc-shape substrate 60 and separated from one another by photo-resistive material 61 forming an electrical circuit from conductor 62 to conductor 63 over the photoresistive material.

One of the conductors 62, shown cross hatched in FIG. 5, extends over a wedge-shaped portion of the code disc 60 in a zig-zag pattern approximately 54° in angular width. The other conductor 63, which is common to all ten sense elements A–J, includes a portion 65 disposed on the code disc 60 adjacent conductor 62 and separated from conductor 62 by the photo-resistive material 61.

Similarly, sense elements A, C and D, also shown in FIG. 3, include individual conductors 72, 82 and 92, respectively, and portions 75, 85 and 95, respectively, of common conductor 63 which are disposed on the code disc 60 adjacent conductors 72, 82 and 92 and separated therefrom by photo-resistive material 61.

It is pointed out that while conductors 65, 75, 85 and 95 are described as forming a common conductor 63, such conductors could be separate conductors.

As can be seen in the plan view of the code member 21 shown in FIG. 5, arcuate portions or segments 72*a* of conductor 72 of sense element A overlap or are interleaved with arcuate portions or segments 62*a* of conductor 62 of sense element B. Similarly, a second arcuate portions 62*b* of conductor 62 overlap or are interleaved with arcuate portions 82*a* of conductor 82 of sense element C. However, the arcuate portions 62*c* of conductor 62 which are intermediate conductor portions 62*a* and 62*b* do not overlap portions of adjacent conductors 72 and 82.

Accordingly, for each sense element, such as element B, the conductor 62*c* defines a discrete area 67 for sense element B which area includes only portions of conductors 62 and 63, and regions 68 and 69, adjacent the discrete area 67, which include interleaved portions of conductors 62, 72 and 62, 82 respectively, of adjacent pairs of sense slements AB, BC, respectively. As shown in FIG. 5, the intermediate portions of each conductor, such as intermediate portions 62*c* of conductor 62, include a plurality of arcuate portions or segments which are concentric with one another and interconnected to form a continuous conductor path over the corresponding discrete area 67 from the periphery towards the center of the code disc 60. Likewise, there are a plurality of arcuate conductor portions, such as portions 62*a* and 62*b* of conductor 62, which extend into the intermediate regions 68, 69, adjacent the discrete area 67. As will be shown, the discrete area for each sense element (area 67 for element B) represents a digit position (position 1 on dial 26) and the regions intermediate each discrete area (regions 68, 69 for element B) represent interdigital positions. As is indicated in FIG. 5, each discrete area (67) and each intermediate region (68, 69) extends over a segment of the code disc 66 approximately 18° in angular width.

A sectional view of a portion of the code disc 60 taken through interleaved portions of sense elements C and D and through a portion of the source 22 which overlies the interleaved elements C and D (FIG. 5) is shown in FIG. 6. A suitable photo-resistive material 61, such as cadmium sulphide or cadmium selenide, is disposed on a surface 64 of the disc-shaped substrate 60 which comprises an electrical insulating material, such as glass or alumina. The conductors 82 and 85 of sense element C are selectively disposed on the photo-resistive material 61 in the zig-zag pattern shown for element B in FIG. 5, whereby conductors 82 and 85 interleave conductor 92 of element C. As can be seen in FIG. 6, the conductors 92, 85 and 82 are separated from one another forming gaps 96 therebetween such that the photoresistive material 61 which is not covered by the conductive material which comprises conductors 82, 85 and 92 is exposed, permitting radiant energy from the source 22, shown to overlie portions of sense elements C and D in FIGS. 5 and 6, to energize the exposed portions of the photo-resistive material 61 associated with sense elements C and D, thereby lowering the resistance of the electrical current path between conductors 82, 85 and 92, 85 over photoresistive material 61. As shown in FIG. 5, the conductors individual to each sense element, such as conductor 82 for sense element C, are extended over a lead 33*a* (for element C) to a respective output circuit, circuit 33 (FIG. 1) for element C, and the common conductor, such as conductor 85 of element C is connected over lead 33*b* to ground. The conductors of the sense elements A–J, such as conductors 82 and 85 of sense element C, may be of aluminum. The fabrication of the code member 21 to provide the pattern of conductors 82 and 85 as shown in FIG. 5 disposed on a photo-resistive surface 64 of the code disc 60 is accomplished using techniques known in the art.

In FIG. 5, the source is shown to overlie a region intermediate sense elements C and D. The radial length L of the portion of the source structure 41 which carries the luminous material 52 is slightly greater than the radial length of the sense elements, such as elements C and D. Moreover, the width W of the structure 41 is slightly less than 18 degrees of angular width so that whenever the shaft is between digit positions C and D as shown in FIG. 5, radiant energy will be directed to an intermediate region of the code disc such as region 98 intermediate sense elements C and D, so that both sense elements C and D will be energized. When the shaft advances to the digit position D, the source will direct radiant energy to a discrete area of the code disc energizing only one sense element to indicate such position.

As will be shown, the resistance of a sense element will change whenever the photoresistive material of the sense element is energized by light from the source 22. This resistance change is detected by associated output circuits 31–40 which provide 20 different sets of outputs representing the 10 digit positions of the shaft 25 in a one or two/10 code.

Each sense element, such as element B, has a maximum resistance value when unenergized and a minimum resistance value when energized by light radiated from the source 22. The amount of resistance change of the photo-resistive material 61 is proportional to the ratio of the conductive material to the area of the photo-resistive material exposed. Thus to obtain a substantial resistance change when the photo resistive material of a given element is energized, the zig-zag configuration (FIG. 5) is used for the conductors of each sense element, such as conductors 62 and 65 of sense element B. In this way, the area of photo-resistive material exposed is a maximum and a maximum resistance change will be obtained for a given light source.

Each of the individual conductors, such as conductor 62 of sense element B, is individually connected to an input of an associated output sensing circuit (circuit 32 for sense element B), and the common conductor 63 (including portions 65, 75, 85, 95) is connected to ground as shown in FIG. 1.

The output detecting circuits 31–40, such as circuit 32 associated with element B, each comprise a field-effect transistor (FET) Q2 having a gate lead connected to the conductor 62, a drain lead connected through a resistor R1 to a voltage source V+, and a source lead connected to ground. The gate lead of the FET is further connected through a resistor R2 to the voltage source V+.

Each sense element such as element B is thus connected between the gate lead and the source lead of an associated FET device (Q2 for element B). The value of resistor R2 is selected to be approximately 10 percent of the resistance provided by the sense element B when the photoresistive material 61 adjacent conductors 62 and 65 is unenergized. Accordingly, the FET device Q2 is normally conducting, and the voltage at the gate is approximately +90 percent V. When the FET device Q2 is conducting, the output level appearing at the drain of the FET device Q2 is approximately ground or zero volts, representing a logic zero level.

When the resistance of the sense element B changes in response to energization by light radiated from the source 22, the voltage at the gate of the FET device Q2 will approach ground potential, and the FET device Q2 will be cut off. When the FET device Q2 is cut off, the output at the drain lead will be approximately +V, which represents a logic 1 level.

Thus, each of the output circuits 31–40 provide a logic 0 level output whenever an associated sense element A–J, respectively is unenergized, and a logic 1 level output whenever an associated sense element is energized.

In FIG. 7 there is shown a graphical representation of the change in the resistance values of sense elements A and B versus the angular position of the source 22 carried by the shaft 25 relative to a zero reference position, such as one edge 80 of sense element A (FIG. 5).

As the source 22 is rotated by the shaft 25 and begins to move over element A, for example, the resistance of sense element A decreases, as shown in FIG. 7, until the source is positioned to overlie a segment of interleaved conductors 72 and 73 which is approximately 2° in width. In such position, the source 22 will provide sufficient radiation to energize the sense element A, and the resistance of the sense element A will have decreased to an intermediate value Rint which is slightly greater than a minimum resistance value Rmin for the element, but less than a threshold value R*t* indicated on the graph of FIG. 7. Output circuit 31 (FIG. 1) associated with element A will be enabled to provide a logic 1 output when the resistance of element A. decreases below the threshold value R*t*. As the source is rotated further to an 18° position over sense element A, and on to a 20° position the resistance will decrease to a minimum value Rmin. When the lagging edge 76 of the source 22 reaches a point approximately 54° from the zero reference, less than 2 percent of the sense element A will be energized and the resistance of element A will begin to increase reaching the maximum value R max when the trailing edge 76 of the source 22 reaches a point 56 from the zero reference. When the resistance value of sense element A exceeds the threshold value R*t*, output circuit 31 will be disabled.

It is pointed out that when the leading edge 77 of the source 22 reaches a point approximately 36° from the zero reference 80, the source 22 will begin to move over element B consequently, the resistance of element B will begin to decrease to the minimum value R min and the output circuit 32 associated with element B will be enabled to provide a logic 1 output when the source overlies a 2° portion of element B. At such time sense elements A and B will be energized concurrently as the source moves over the intermediate region 69 of the code member.

Thus, the concurrent energization of two sense elements serves to indicate that the source (and correspondingly shaft 25 and pointer 27 carried thereby) is in an intermediate region of adjacent sense elements whereas the energization of only one sense element indicates that the source is overlying a discrete area of the code member.

Figures 8, 8A:
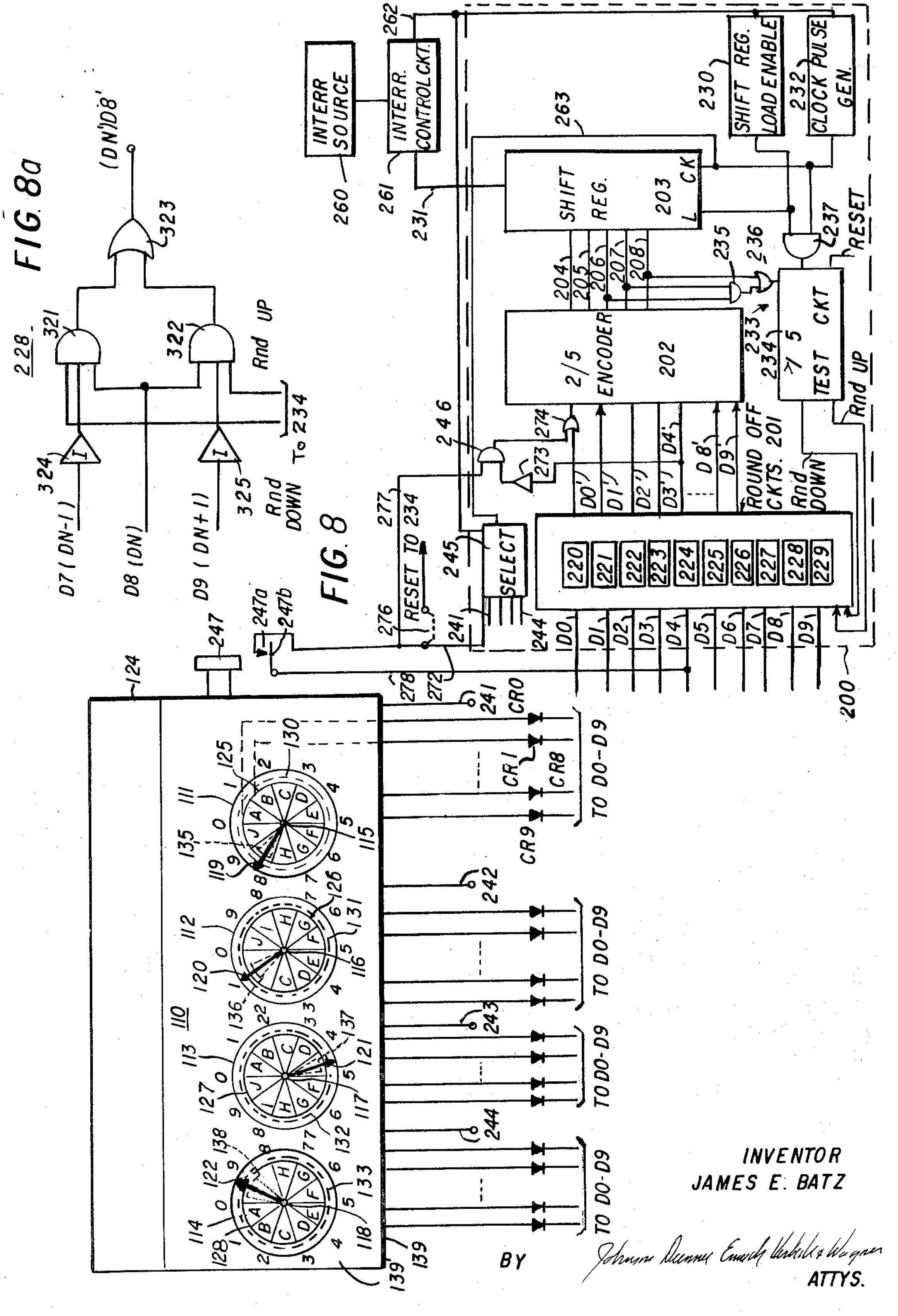
FIG. 8 is a schematic block diagram of a multidial register employing the encoder of the present invention to provide coded outputs representing angular positions of a plurality of shafts, and output decoding circuits for decoding the encoder outputs.
FIG. 8*a* is a schematic block diagram of a portion of the round off circuits which comprise the output decoding circuits shown in FIG. 8.

Digressing, when the encoder 20 (FIG. 1) is used in utility meter applications, a plurality of dials, such as dial 26 comprise a register, such as register 110 shown in FIG. 8 for indicating quantums of a commodity measured by a meter. Register 110 has four clock-type dials 111–114 for providing a four digit reading with dials 111–114 representing units, tens, hundreds and thousandths, digits of the reading respectively. Each dial, such as dial 111, has an associated shaft 115 which carries a pointer 119 cooperative with numbers 0–9 on the dial 111 for indicating one of ten positions 0–9 of the shaft 115.

Input drive to the register 110 is provided by measuring means 124 of the meter which effects rotation of shaft 115 of the units dial in accordance with quantums of a commodity measured by the measuring means 124. Shafts 115, 116, 117 and 118 are interconnected by a gear train (not shown) of the type which is conventional in the art of meter registers such that shaft 115, driven by the measuring means 124, effects rotation of shafts 116–118 whereby shaft 116 rotates one revolution for each ten revolutions of shaft 115, shaft 117 rotates once for each 100 revolutions of shaft 115, and shaft 118 rotates once for each 1,000 revolutions of shaft 115.

Each of the dials 111–114, such as dial 111, has an associated encoder 125–128, respectively for converting the angular position of a corresponding shaft 115 to coded output signals. The encoder 125–128 associated with dials 111–114 respectively, are similar to encoder 20 shown in FIG. 1 and include code discs 130–133, respectively, each having 10 sense elements A–J and energizing sources 135–138, mounted on associated shafts 115–119, respectively, for rotation with the shafts. The encoders 125 are enclosed within a light tight housing 139 to prevent ambient light from reaching the code members of the encoders 125–128.

The manner of operation to provide selective energization of the sense element A–J of the encoders 125–128 has been described above for the encoder 20 shown in FIG. 1. However, read out of the information provided by energization of the sense elements A–J is effected through the use of ten diodes such as diodes CR0–CR9, individually connected to the segments A–J, respectively, which replace the output circuits 31–40, of the converter 20 shown in FIG. 1.

In clock-type dial registers, the code discs, such as disc 120 associated with dial 111, are mounted on the shaft such that the surface of the code disc 130 extends parallel to the dial face plate 139'. However, it is pointed out that the encoders 125 may also be used in registers having other configurations, such as the odometer-type register 110' shown in FIG. 9 which provides a "digital" read-out of metered quantities. In this type of register, the code discs 130'–133' are coaxially algined and the associated source apparatus 135'–138' are driven by shafts 115'–118' associated with the register 110' to effect selective energization of the sense elements of the code members 130'–133'.

Referring again to FIG. 8, in utility meter applications the code discs such as disc 131 of encoder 126 are aligned relative to the associated clock-register dial 112 which overlies the code disc 131 so that the sense elements A–J of code disc 130, which represent digit positions of the shaft 116 are located intermediate adjacent pairs of the numbers 0–9 on dial 112. Thus, when the source 136 of encoder 126 which is carried by shaft 116 overlies only one sense element, such as sense element A, to indicate a digit position, the pointer 120 will be positioned intermediate dial positions 0 and 1, and when the source 136 overlies a pair of adjacent elements, such as elements A and B as shown in FIG. 8, the pointer 120 will be near one of the digits, such as digit 1.

When the pointer 120 is positioned intermediate numbers 0 and 1 of dial 112, it is certain that the reading of the dial 112 is greater than 0, but is not yet 1. Accordingly, when only one sense element such as sense element A is energized, the outputs provided over diodes CR0–CR9 will represent a digit position, position 0 in this case, even though the pointer 120 has already passed the number 0 on the dial 112.

This is in accordance with standard utility meter reading practice wherein the digit read of a dial, such as the tens dial 112 will be rounded down until the previous digit read has passed the zero mark on the dial, and the indicator, such as pointer 119 of the units dial 111, has passed the zero position on the indicator dial 111.

When the pointer 120 (and the source 136) is positioned in close proximity to number 1 of dial 112 as indicated in FIG. 8, two sense elements A and B will be energized providing outputs which indicate that the dial reading is changing from the digit 0 to the digit 1. At such time, a decision has to be made as to whether the reading of the dial 112 should be 0 or 1.

The determination as to whether the reading of dial 112 should be rounded down to 0 or rounded up to 1 is made in accordance with the previous digit read (the units digit of dial 111 in the exemplary illustration). If the reading of the units dial 111 is zero or slightly greater, the reading of the tens dial 112 will be rounded up to 1. On the other hand, if the reading of the units dial 111 is less than 0, the reading of the tens dial 112 will be rounded down to 0. Since in the present example the reading of the units dial is 8 and the pointer 119 associated with the units dial has not yet reached zero, the reading of the tens dial 112 will be rounded down to 0. Such round off operations are provided by round off circuits 200 (FIG. 8) and the manner in which these circuits 200 effect round off of the readings will be described hereinafter.

It is pointed out that while the encoder is described in an application for use in a utility meter reading system, the encoder may also be used in other applications wherein it may be desirable to align the register dial, such as dial 111, relative to the code member 130 such that the sense elements A–J which represent digit positions of the shaft 115 are located adjacent the numbers 0–9 of the dial 111, respectively, and the digit positions correspond directly to the numbers 0–9 of the dial register 111.

Second Embodiment of the Code Member

Figure 10:
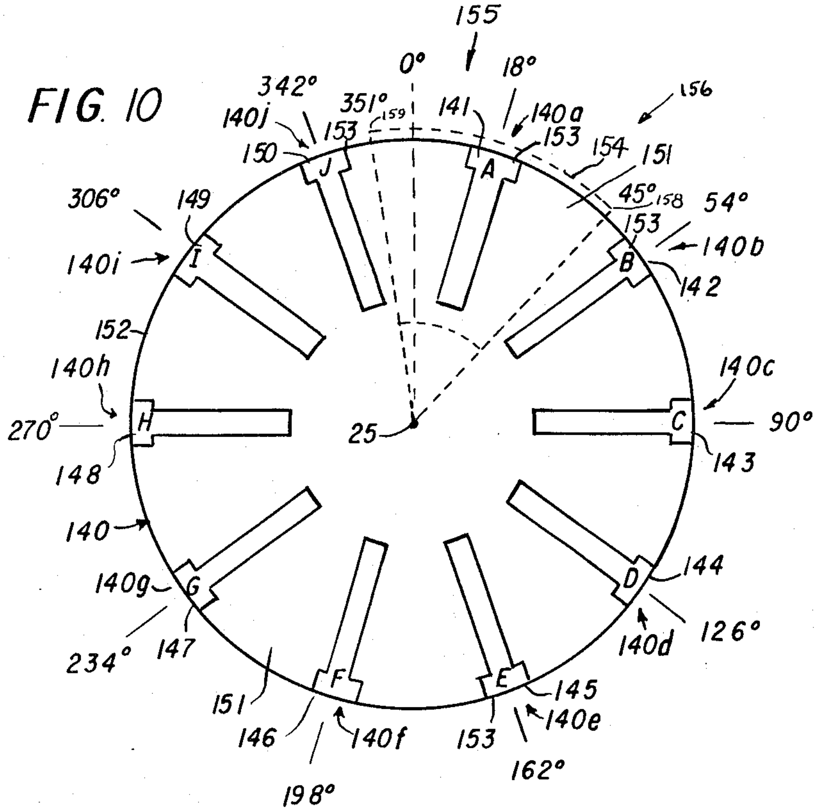
FIG. 10 is a plan view of a second embodiment for a code member for the encoder shown in FIG. 1.

A plan view for a second embodiment of a code disc 140 is given in FIG. 10. The code member 140 comprises ten discrete areas **140*a*–140*j* each including a sense element A–J. Each sense element A–J represents one of the 10 positions of the shaft 25 to the indicator. The sense elements A–J comprise a pair of conductors such as conductors 141, 151 for element A which are disposed on a code disc 152. The conductors 141, 151 are separated from one another by photo resistive material 153. The code member 140 includes ten conductors 141–150 which are individually associated with sense elements A–J, respectively, and a common conductor 151** which is commond to the ten sense elements A–J.

The construction of code member 140 is similar to that of code member 21 described with reference to FIG. 6. The code disc 152 has a surface coated with photo resistive material 153 and the conductors 141–151 are selectively deposited on the photo resist coated surface in the pattern shown in the plan view of the code member 140 given in FIG. 10 wherein only narrow strips of photo resistive material are exposed between adjacent conductor pairs such as conductors 141–151.

The individual conductors 141–150 are substantially T-shaped and extend radially along from the periphery of the disc towards the center of the disc. The common conductor 151 covers the majority of the remaining portion of the surface of the code disc 152 to provide the narrow strips of photo resistive material 153 which are exposed between adjacent conductors such as 141, 151. The straight line pattern used in the second embodiment for the code disc 140 permits narrower line widths to be obtained for the photo resist material 153 which separates each conductor pair of a sense element, and accordingly, the length of the photo resistive strips or portions of photo resistive material exposed is shorter than that of the embodiment for the code disc shown in FIG. 5. However, the ratio of the length to width of the photo resistive material which is exposed is still maximum and accordingly, code member 140 will provide operating characteristics which are similar to those of the code member 21 shown in FIG. 5.

Thus, the intensity of the source 154 for energizing the sense elements A–J of code member 140 is approximately the same as the intensity of source 22 used to energize sense elements A–J of code member 21 (shown in FIG. 5); however, the width of source 154, shown by the broken line in FIG. 10, is approximately 54° in angular width or approximately three times the width of source 22. Such additional width is required to permit the source to energize two photo-resistive areas such as areas 155 and 156 concurrently to provide an indication that the shaft is at a position intermediate adjacent digit positions.

Each discrete area, such as area **140*a*, comprises a wedge-shape portion of the code disc 152** which is approximately 3° in angular width. The center line of each sense element (or discrete areas) is based or located 36° from the center line of adjacent sense elements.

Thus, for example, sense element A is centered 18° from the zero degree position indicated on disc 152, sense element B is centered 54° from the zero reference position etc.

Regions intermediate each pair of adjacent sense elements such as region 155 intermediate sense elements J and A, and region 156 intermediate sense elements A and B are comprised of the common conductor 151.

Figure 11:
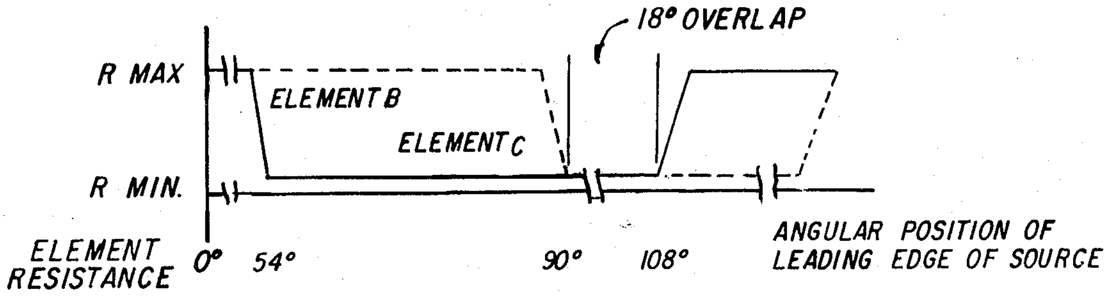
FIG. 11 is a graphical representation of the change in resistance of the photo-resistive sense elements of the code member shown in FIG. 10 versus angular positions of the source.

Referring to FIG. 11, which shows the relationship between the resistance of the sense elements B and C and the angular position of the leading edge 158 of the source 154 (FIG. 10, when the leading edge 158 of the source reaches a point approximately 54° from the zero reference of the code disc 166, sense element B will be energized as indicated by the solid line in FIG. 11 showing the resistance decreasing from the maximum value R max to the minimum value R min. Such resistance change for any one of the sense elements A–J, such as element B, occurs as a source moves over approximately 3° of angular distance, with the resistance beginning to decrease when the source reaches a point 52½° from the zero reference and the resistance being a minimum when the leading edge 158 of the source 154 reaches a point 55½° from the zero reference.

Sense element B will remain energized to provide a minimum resistance R min. until the leading edge of the source 154 has reached a point approximately 108° from the zero reference at which time, the lagging edge 159 of the source 154 will be passing over the conductor 142 of sense element B causing radiant energy to be no longer supplied to the sense element 3 whereby the resistance increases to the maximum value.

When the leading edge of the source 154 reaches a point approximately 88½° from the reference point, the source 154 will begin to overlie sense element C which when energized will provide change in resistance from the maximum value R max to the minimum value R min. As shown in FIG. 11, there exists a region approximately 18° in width as the leading edge 158 of the source 154 moves from a point approximately 90° to a point approximately 108° from the zero reference. At such time, sense elements B and C will be energized concurrently to provide outputs indicating that the shaft is intermediate one of the predetermined digit positions.

Output Code Pattern

The illustrated embodiments of the analog-to-digital converter provide outputs coded to represent 20 10-bit binary words to allow resolution of ten digit positions of the shaft 25 to indicate which of the digits 0–9 of the dial 26 the pointer 27 is adjacent. The twenty code words are listed in Table I.

TABLE I—CODING FOR DIGIT POSITIONS

| DIGIT POSITION | SEGMENT OUTPUT A B C D E | F G H I J |
|---|---|---|
| 0 | 1 0 0 0 0 | 0 0 0 0 0 |
| ½ | 1 1 0 0 0 | 0 0 0 0 0 |
| 1 | 0 1 0 0 0 | 0 0 0 0 0 |
| 1½ | 0 1 1 0 0 | 0 0 0 0 0 |
| 2 | 0 0 1 0 0 | 0 0 0 0 0 |
| 2½ | 0 0 1 1 0 | 0 0 0 0 0 |
| 3 | 0 0 0 1 0 | 0 0 0 0 0 |
| 3½ | 0 0 0 1 1 | 0 0 0 0 0 |
| 4 | 0 0 0 0 1 | 0 0 0 0 0 |
| 4½ | 0 0 0 0 1 | 1 0 0 0 0 |
| 5 | 0 0 0 0 0 | 1 0 0 0 0 |
| 5½ | 0 0 0 0 0 | 1 1 0 0 0 |
| 6 | 0 0 0 0 0 | 0 1 0 0 0 |
| 6½ | 0 0 0 0 0 | 0 1 1 0 0 |
| 7 | 0 0 0 0 0 | 0 0 1 0 0 |
| 7½ | 0 0 0 0 0 | 0 0 1 1 0 |
| 8 | 0 0 0 0 0 | 0 0 0 1 0 |
| 8½ | 0 0 0 0 0 | 0 0 0 1 1 |
| 9 | 0 0 0 0 0 | 0 0 0 0 1 |
| 9½ | 1 0 0 0 0 | 0 0 0 0 1 |
| 0 | 1 0 0 0 0 | 0 0 0 0 0 |

As can be seen in Table I, each code word, such as the code word representing the coding for the zero position of the shaft (between dial numbers 0 and 1), comprises ten bits (each provided as an output of a sense element A–J) with the bits A through J providing a binary coding, logic 1 or logic 0, representing whether a segment is energized or unenergized, respectively. Thus, for example, in the coding for the digit 0, segment A output is a logic one and segment B–J outputs are logic 0's, indicating that segment A is energized and segments B–J are not energized. In the coding for the position intermediate to zero and the one digit position (dial numeral 1), the outputs for segments A and B are logic ones and the outputs for segments C–J are logic zeros indicating that segments A and B are energized and that segment C–J are not energized.

The code provides a different ten bit binary code word for each of the 10 digit positions 0–9, and 10 interdigital positions ½, 1½, etc., which permit roundoff to one of the whole digit positions 0–9. An unambiguous code is obtained for 10 whole digit positions of the shaft because for a given code word, there is only one region of the dial represented by that code word. In addition, there is a difference or change in only one bit between the code word for a given region and the code word representing the previous or subsequent region. The 10 interdigital code words include logic 1 bits which, when compared with data previously read out permit roundoff to a whole digit permitting the code word for such region to be provided.

Operation of the Encoder

Figure 12:
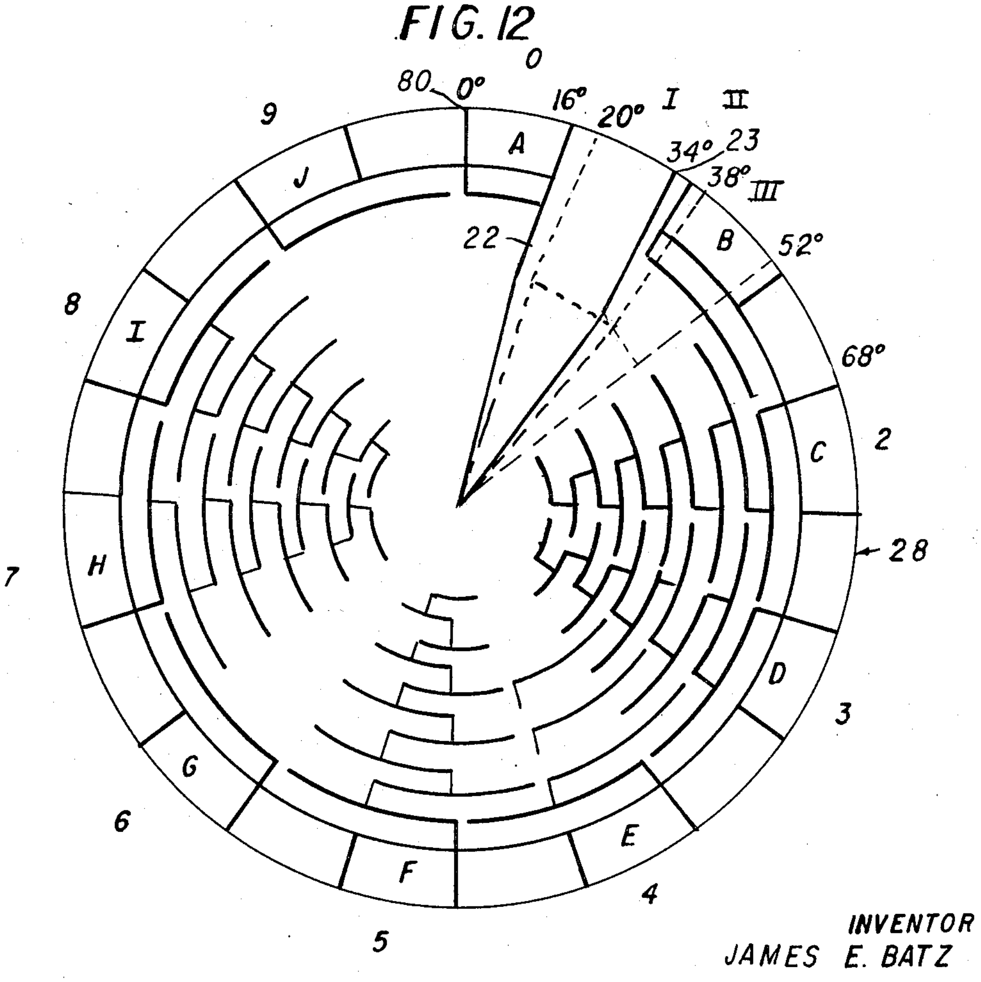
FIG. 12 is a schematic representation of the code member and source shown in FIG. 5 in which the source is shown at different positions relative to the sense elements for use in the description of the operation of the encoder.

Referring to FIG. 12 which is a schematic view of the code member 21 (FIG 5) showing representations of the ten sense elements A–J, when the source 22 is at position I with the leading edge 23 of the source 22 being positioned to overlie approximately 34° from the zero reference (edge 80 of the sense element A), sense element A will be energized, and sense elements B–J will be unenergized. Accordingly, the resistance of sense element A will be at its minimum value, and circuit 31 (FIG. 1) associated with sense element A, will be disabled to provide a logic 1. The other output circuits 32–40 will remain enabled providing logic 0 outputs. Thus, the logic word provided over output circuits 31–40 will be the coding for the digit position 0 as shown in Table I.

As the source 22 rotates due to shaft rotation so that the leading edge 23 of the source 22 has been moved 4° in a clockwise direction to a point approximately 38° away from the zero reference, the source 22 will then cover approximately 2° of sense element B. Accordingly, sense element B will become energized while sense element A remains energized. Therefore, logic 1 outputs are provided over output circuits 31 and 32 while the other output circuits 33–40 provide logic 0 outputs. Thus, when the source 22 has reached the position shown at II the logic word provided represents the coding for the digit position ½ which is intermediate the 0 and 1 digit positions (dial position 1).

As the source 22 continues to move in a clockwise direction approximately 14°, the leading edge 23 of the source 22 will have moved approximately 52° from the zero reference. At such point, less than 2° of the sense element A will be energized by the source 22 and accordingly the resistance of sense element A will begin to increase disabling output circuit 31. Sense element B will remain energized, and accordingly, output circuit 32 will provide a logic 1 output while output circuits 31 and 33–40 will provide logic 0 outputs such that the logic word provided is the coding for the digit position as shown in Table I.

As the source 22 continues to be moved over sense elements C–J in succession, the sense elements C–J will be selectively energized, sequentially, providing the logic outputs over output circuits 31–40 which represent the output words given in Table I representing the coding for digit positions 2–9, and the intermediate positions 2½, 3½, etc.

The operation of an encoder employing code disc 161 and source 122 (FIG. 10) to provide the output words given in Table I is similar to that described in the foregoing.

Output Decoder Circuits

The output decoder or readout circuits 200 include roundoff circuits 201 which convert each set of output signals to a 2/5 code, an output shift register 203 having input connected to outputs 204–208 of the encoder circuits 202 for storing the output data and permitting serial readout of the encoded data, a select circuit or sequencer 245, a shift register load enable circuit 230 and a clock pulse generator 232.

One method of effecting readout of meter reading data provided in a register at a remote meter location is described in an earlier application U.S. Ser. No. 883,890 of James Batz, filed Dec. 10, 1969. In the method described in this application, interrogate signals transmitted from an interrogate source to a remote meter installation effect the connection of power to readout circuits at the remote location causing data signals provided at the meter location by encoding apparatus to be loaded into a shift register and to be read out serially responsive to pulses from a clock pulse generator.

In the present application, interrogate signals may be transmitted from an interrogate source 260 and received by a control circuit 261 to effect energization of the output decoder circuits 200 over conductor 262 whereby data provided by the encoding apparatus associated with meter register 110 would be loaded into the shift register 203 under the control of the select circuit 245 and the shift register load enable circuit 230, and read out serially over conductor 231 by clock pulses provided by the clock pulse generator circuit 232 for transmission back to the interrogation source 260 via the control circuit 261.

A set of output signals representing the angular positions of one of the four shafts 115–118 of dials 111–114, respectively, such as shaft 115 of dial 111, is provided over conductors D0–D9 by the encoders 125–128, when the respective encoder such as encoder 125 associated with the dial 111 is enabled by an enabling signal provided by the select circuit 245. As will be shown, encoders 125–128 are enabled sequentially by the select circuit 245 to effect readout of the data representing the reading of dials 111–114.

By way of example, to read out dial 111, an enabling signal +V from select circuit 245 is provided at encoder enabling input 241 of encoder 125 and is extended to the common conductor of each sense element A–J of the associated code disc 130 (for example, common conductor 151 of code disc 140, FIG. 10). The individual conductors of each sense element A–J (such as conductors 141–150 of the code member 140 shown in FIG. 10) are individually connected over respective diodes CR0–CR9 to output conductors D0–D9. It is pointed out that the encoding apparatus associated with the meter register 110, shown in FIG. 8, does not employ individual output detecting circuits, such as output circuits 30 shown in FIG. 1.

Accordingly, for readout of dail 111, the enabling signal +V (logic 1 level) from select circuit 245 applied to enable input 241 is conducted over energized sense elements which exhibit low resistance, such as element 1, when the source is in the position shown in FIG. 8, and diode CR8 to output conductor D8. However, unenergized sense elements, such as elements A–H, and J prevent passage of the enabling signal to the remaining conductors D0–D7 and D9 which remain at potentials representing logic 0 levels.

It is pointed out that the shaft 115 of dial 111 rotates clockwise and that shaft 116 of dial 112 rotates counterclockwise. However, sense elements A–J of the encoder 126 associated with dial 112 are disposed in a counterclockwise relationship, and the sense elements A–J of the encoder 125 associated with dial 111 are disposed in a clockwise relationship, and thus outputs representing the state of sense elements A–J of encoders 126 and 125, respectively, are provided over conductors D0–D9, for both encoders whenever an enabling signal is applied to respective enabling inputs 242 and 241.

The outputs provided over conductors D0–D9 by one of the encoders associated with dials 111–114 are passed to inputs of the roundoff circuit 201. The roundoff circuit 201 accepts inputs D0–D9 of which inputs one or two may be logic 1 levels and the remaining inputs logic 0 levels. The roundoff circuit 201 produces a logic 1 output on only one output conductor D0′ – D9′ according to the following logic equation:

1. $Dn' = (Dn \cdot \overline{Dn-1} \cdot \text{Rnd Dwn}) + (Dn \cdot \overline{Dn+1} \cdot \text{RndUp})$ It should be noted that when $Dn = D0$, $Dn-1 = D9$ and when $Dn = D9$, $Dn+1 = D0$.

The roundoff circuit 201 consists of ten independent and identical stages of AND/OR networks 220–229, such as network 228 shown in FIG. 8*a* to include a pair of AND gates 321, 322 an OR gate 323, and inverters 324, 325.

In the present example, wherein it is assumed that a reading of 8 is indicated on dial 111 and that sense element 1 is energized so that a logic 1 level appears on conductors D8 and logic 0 levels appear on conductors D0–D7 and D9, network 228 will be enabled to provide a logic 1 level at output D8′ and network 220–227 and 229 will be disabled to provide logic 0 levels as will be shown hereinafter.

The outputs D0′ – D9′ of the roundoff circuit 201 are passed to inputs of the 2/5 encoder circuit 202 which encodes the signals on conductors D0′– D9′ into a five bit output code in which only two of the five bits are true for any input according to the truth table given in Table II.

TABLE II

TRUTH TABLE FOR OUTPUT ENCODER

| DIGIT | ENCODER INPUT | CONDUCTOR OUTPUT LEVEL | | | | |
|---|---|---|---|---|---|---|
| | | 204 | 205 | 206 | 207 | 208 |
| 0 | D0' | 1 | 1 | 0 | 0 | 0 |
| 1 | D1' | 1 | 0 | 1 | 0 | 0 |
| 2 | D2' | 0 | 1 | 1 | 0 | 0 |
| 3 | D3' | 1 | 0 | 0 | 1 | 0 |
| 4 | D4' | 0 | 1 | 0 | 1 | 0 |
| 5 | D5' | 0 | 0 | 1 | 1 | 0 |
| 6 | D6' | 1 | 0 | 0 | 0 | 1 |
| 7 | D7' | 0 | 1 | 0 | 0 | 1 |
| 8 | D8' | 0 | 0 | 1 | 0 | 1 |
| 9 | D9' | 0 | 0 | 0 | 1 | 1 |

The outputs provided over conductors 204–208 by the encoder circuits 202 are extended to parallel inputs of a five bit output shift register 203. The data inputs provided by the encoder circuits 202 when enabled by the select circuit 245, are loaded into the shift register 203 responsive to a load enable pulse provided by shift register load enable circuit 230. The data bits are clocked out serially over output 231 to control circuit 261 by clock pulses from clock pulse generator circuit 232 and are transmitted back to the interrogate source 260.

The clock pulse generator 232, is free running and accordingly when energized in response to an interrogate command signal from control circuit 261 over conductor 262 will provide a continuous train of clock pulses. The sequencing of the loading of data into the shift register 203 is controlled by the select circuit 245. Under the control of the select circuit 245, the five-bit data word representing the reading of dial 111 is loaded into the shift register 203 before the first clock pulse is provided. Each clock pulse is fed over lead 263 to the select circuit 245. In response to each series of five clock pulses, the select circuit 245 effects loading of the next data word by enabling the load enable circuit 230. Thus, after five clock pulses have been received by the select circuit 245, the five-bit word representing the reading of dial 111 will have been read out and the next data word representing the reading of dial 112 will be loaded into the shift register when the load enable circuit is enabled by the select circuit 245. Similarly, the loading of the data word representing the reading of dial 113 into shift register 203 will be effected after five more clock pulses have been provided, and the data word for the dial 114 will be loaded into shift register 203 after a further series of five clock pulses have been provided.

Roundoff Test Circuit

The roundoff test enable circuit 233 comprises a flip flop 234 and input set gates 235–237 to provide the roundup signal Rnd Up and the round down signal Rnd Dwn. The test enable flip flop 234 is reset to provide the roundup signal prior to each readout of the register 110, and accordingly, the reading of the first dial 111, will be rounded up whenever roundoff function is required. For roundoff of the readings of the dials 112–114, the test circuit 233 is controlled by the data representing the digit being read out to provide roundoff information for the next successive digit read out. Thus, for example, the value of the units digit will determine whether the value of the tens digit is rounded up or rounded down; the value of the tens digit will determine whether the value of the hundreds digit is rounded up or down, etc.

As can be seen in Table II, logic 1 outputs on conductors 206 and 207 represent the coding for the digit 5, and logic 1 outputs are present on conductor 208 only for digits 6–9. These outputs are combined by AND gate 235 and OR gate 236 to provide control inputs to the test circuit flip flop 234. A set command for the flip flop is provided by gate 237 whenever gate 237 is enabled by concurrent pulses from the load enable circuit 230 and the clock pulse generator 232.

Whenever the previous digit read out is less than five, the control input to the test circuit 233 is logic 0 so that the flip flop 234 will not be set by the set pulse provided over gate 237 when the output data is loaded into the shift register 203. In such case, the roundup output at the negative output of the test circuit flip flop 234 will be at logic 1 level. On the other hand, whenever the previous digit readout is equal to or greater than five, the control input to flip flop 234 will be at logic 1 level and the flip flop 234 will be set by the pulse provided over gate 237 as the output data is loaded into the shift register 203.

Operation of the Encoder Circuits

Readout of the data available at the meter location is effected when interrogate signals transmitted to the meter location from the interrogate source 260 are received by control circuit 261. The control circuit 261 energizes the readout circuits 200 causing the meter reading data words for each of the dials 111–114 to be loaded into the shift register 203 and readout by clock pulses from clock pulse generator 232.

Assuming the value of the meter reading to be 9508 in accordance with the angular positions of the shafts 115–118 for the dials 111–114 shown in FIG. 8, the units dial 111 is read out first, and the thousands dial 114 is read out last under the control of the select circuit 245 which provides outputs +V on leads 241–244 in sequence. It is pointed out that prior to providing enabling signals +V for encoder inputs 241–244, the select circuit provides a reset input over output 272 and link 276 to the test circuit flip flop 234 which resets prior to readout of the units digit. Accordingly, the units digit will automatically be rounded up.

Thus, for example, considering readout of the data representing the reading of the units dial 111 provided by the encoder 125, the source 135 is positioned over sense element I, such that element I is energized.

When enabling signal +V is provided at input 241, a logic 1 level signal will be present on conductor D8 while logic 0 levels are present on conductors D0–D7 and D9. These outputs which represent the coding for the digit 8 are extended to roundoff gate stages 220–229 of the roundoff circuit 201.

The inputs to stages 220–227 and 229 are logic 0 levels and the input to stage 228 is a logic 1 level. Referring to FIG. 8a, network 228 is operable to compare the logic words (Table I) representing readings of the digit positions 7½, 8 and 8½, to permit either round up of the reading from 7½ to 8 or round down of the reading from 8½ to 8 in a manner which will become apparent.

The inputs to network 228 are provided over conductors D7, D8, D9, and outputs Rnd Up, Rnd Dwn from a roundoff test circuit 233. Inputs D7 and D9 are inverted by inverters 324, 325, respectively. Thus, the inputs to AND gate 321 are $\overline{D7}$, D8 and Rnd Down and the inputs to AND gate 322 are D8, $\overline{D9}$ and Rnd Up. The outputs of the AND gates 321 and 322 are combined by OR gate 323 to provide the output D8'. When roundoff stage or network 228 is enabled, a logic 1 level is provided at output D8' for representing the digit position 8.

In the present example for the read out of the units digit, input D8 of network 228 is a logic 1 level, and inputs D7 and D9 are logic 0 levels. Moreover, the test enable circuit flip flop 233 is reset and thus the round down output is at logic 0 level and the round up output is at logic 1 level. Accordingly, gate 321 will be disabled and gates 322 and 323 will be enabled providing a logic 1 output at D8'.

Each of the remaining stages 220–227 and 229 also have five inputs in accordance with equation (1), three of the inputs being provided over certain of the conductors D0–D9 and the two other inputs, Rnd Up and Rnd Dwn, being provided by the test enable circuit 233. Since inputs D0–D7 and D9 to gate networks 220–227 and 229, respectively, are logic 0 levels, stages 220–227 and 229 will be disabled, providing logic 0 levels at outputs D0'–D7' and D9'.

The outputs D0'–D9' are encoded by encoder circuits 202 to provide outputs on conductors 204–208 representing the coding (00101) for the digit 8 as given in Table II.

The output data on conductors 204–208 is loaded into the shift register 203 and then read out of the shift register 203 serially by clock pulses to provide data, in a 2/5 code representing the position of shaft 115 of dial 111, over output 231 to control circuit 261. When shift register 203 is loaded, the signals on outputs 206–208 are effective to set the test circuit flip flop 234 when concurrent pulses are provided by the shift register load enable circuit 230 and the clock pulse generator to enable gate 237.

Considering read out of the data representing the tens digit 112 provided by the encoder 126, the source 136 is positioned over sense elements A and B of code member 131 such that elements A and B are energized. When the enabling signal +V is provided to input 242, logic 1 level signals will be present on conductors D0 and D1, while logic 0 levels are provided on conductors D2–D9. These outputs which represent the coding for the position ½ (Table I), are extended to the round off circuit 201.

Since the digit previously read out i.e., digit 8 (from units dial 111), was greater than 5, the test circuit flip flop 234 is set, providing the round down signal. Accordingly, the digit code for one-half will be rounded down to the digit code for zero, and a logic 1 level will be provided on output D0', and logic 0 levels will be provided on the remaining outputs D1' – D9'.

Such outputs over D0'–D9' are encoded by encoder circuits 202 to provide the coding (11000) for the digit 0, as given in Table II, on outputs 205–208 in the manner described with reference to read out of the units dial 111. These outputs are loaded into the shift register 203 under the control of the select circuit 245 and the load enable circuit 230. It is pointed out that since the signal levels on outputs 206–208 are logic 0 levels, the test circuit flip flop 234 will be reset when gate 237 is enabled by pulses from the load enable circuit 230 and the clock pulse generator circuit 232, to provide the round up signal for read out of the subsequent dial 113. Thus, when the hundreds dial 113 is read out, the reading will be rounded up to 5. In the case of the reading of the thousandths dial 114, the hundreds dial reading of 5 will cause the reading to be rounded up to 9.

Cathodic Protection Circuits

In addition to meter reading data, the meter readout system shown in FIG. 8 can provide information for indicating other conditions pertaining to the meter reading apparatus. In one such application in a gas metering system, transducer apparatus is provided for monitoring the condition of gas pipes at the consumer location and providing a signal indicating the physical condition of the gas pipe at such locations.

Figure 9:
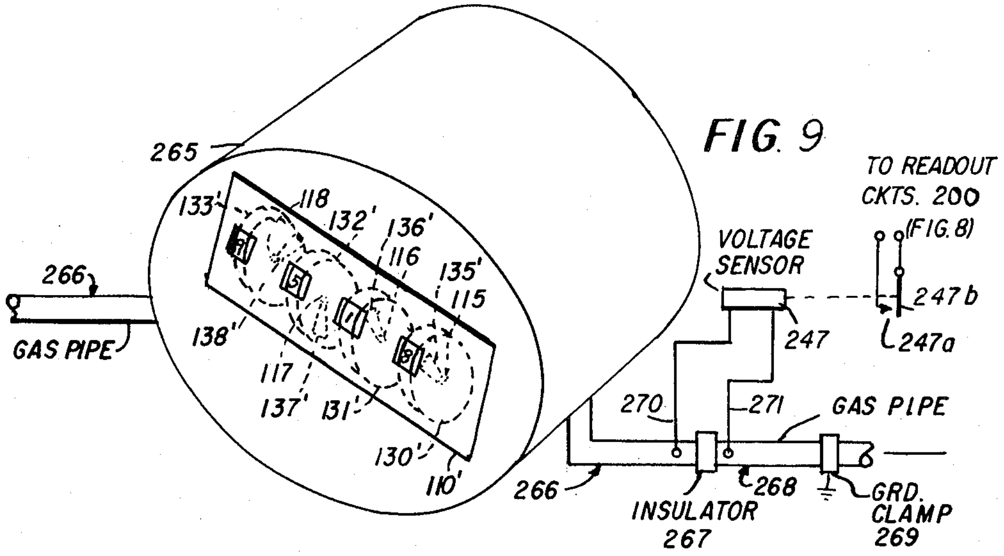
FIG. 9 is a representation of a cyclometer register employing the encoder of the present invention.

A schematic representation of a meter installation is shown in FIG. 9. The installation includes a gas meter 265 for metering gas flow over a gas pipe 266. In typical installations, an insulator 267 is interposed between the incoming section of the pipe 266, which extends to a gas source, and the output section 268 of the pipe which is connected to apparatus fueled by the gas. The output section of the pipe 268 is normally grounded by a suitable ground clamp 269.

A cathodic protection circuit including a sensing device 247 monitors the potential difference between the two sections of pipe. The sensing device 247 has a pair of energizing leads 270,271 connected to sections 266 and 268, respectively of the gas pipe. When the potential difference between the two sections exceeds a predetermined threshold value, the sensing device 247 will be enabled to provide an output over an associated pair of contacts 247*a*, 247*b*. A sensing device suitable for this application is a voltage sensing relay Model 575 manufactured by California Electric Mfg. Co. Inc. of Alamo Calif.

Referring to FIG. 8, the contacts 247*a* and 247*b* of the sensing device 247 are connected to inputs of the readout circuits whereby the condition of the gas pipe as represented by the potential difference between the pipe sections 266,268 (FIG. 9) is converted into a data word for transmission to the interrogate source 260 over the readout circuits 200.

In one exemplary illustration, when the potential difference is below the threshold level and the sensing device 247 is unoperated, a logic word 11000 representing the coding for the digit 0 is provided by readout circuits 200. On the other hand, whenever the potential difference has exceeded the threshold value and the sensing device 247 is operated, a different logic word 01010 representing the coding for the digit 4 is provided.

As shown in FIG. 8, one contact 247*a* of the sensing device 247 is connected to an output 272 of the select circuit 245, and over lead 277 to an input of an AND gate 246. Output conductor D4' of round off circuit 201 is connected over an inverter 273 to a second input of AND gate 246. The output of AND gate 246 is connected to an input of an OR gate 274 the output of which is connected to the D0' input of the 2/5 encoder circuit 202. The D0' output of the round off circuit 201 is connected to a second input of OR gate 274.

The other contact 247*b* of sensing device 247 is connected over lead 278 to output conductor D4 at the D4 input of the roundoff circuits 201.

Operation of Cathodic Protection Circuit

In one mode of operation the state of the cathodic protection circuits is read out prior to the reading out of the data words representing the reading of the meter. Assuming the sensing device 247 is not operated, and that contacts 247*a* and 247*b* are open, initially logic 0 levels will be present on conductors D0–D9 at the inputs to the round off circuits 201. Accordingly, the output D4′ will also be logic 0 level and this output, inverted by inverter 273, provides a logic 1 input to AND gate 246.

When the select circuit 245 is energized responsive to an energizing signal received over conductor 262 from the control circuit 261, a +V signal will be conducted over output 272 of the select circuit 245 and lead 277 enabling gate 246.

When gate 246 is enabled, the output of gate 246 will enable OR gate 274 to provide a logic 1 output at the D0′ input of encoder 202. Accordingly, encoder 202 will provide outputs 11000 over conductors 204–208, respectively, such outputs representing the coding for the digit 0 which, as indicated above, indicates that the potential difference is below the threshold level and the sensing device 247 is unoperated.

The outputs on conductors 204–208 will be loaded into the shift register 203 and read out serially by pulses from the clock pulse generator in the manner described with reference to read out of data indicating the meter reading.

Alternatively, assuming the sensing device is operated, and that contacts 247*a* and 247*b* are closed, when the select circuit 245 is energized the +V signal provided over output 272 of select circuit 245 will be conducted over conductor 278 to output conductor D4 at the input of the round off circuit 201. Thus, a logic 1 level will be provided on output D4′ of the round off circuits and encoder 202 will provide outputs 01010 over conductors 204–208 representing the coding for the digit 4. The outputs on conductors 204–208 will be loaded into the shift register 203 and read out serially by pulses from the clock pulses generator 232.

It is pointed out that both of the outputs representing a cathodic protection reading, namely 0 or 4, are less than five. Accordingly, link 276 can be removed and these outputs can be used to effect resetting of the round off test circuit 233 prior to read out of the first digit of the meter reading, the digit representing the reading of register 111. The reset function will be accomplished in the manner described with reference to the read out of the four dials 111–114 in the foregoing description.

I claim:

1. In an analog-to-digital converter for providing a different set of output signals for each of a plurality of predetermined angular positions of a shaft, an encoder including a code disc having a surface covered with a photoresistive material and a plurality of pairs of conductors disposed on said photoresistive material and extending from the periphery of the code disc toward the center of said code disc in a spaced relationship forming a gap therebetween thereby exposing a continuous narrow strip of the photoresistive material in said gap such that each pair of conductors defines a separate photoresistive sense element, each of said sense elements having a first resistance when energized and a second resistance when unenergized, source means mounted for rotation by said shaft in enabling relationship with said sense elements including radiant energy means having a phosphor stimulated by radiations from a radioactive element to emit light for selectively energizing different ones of said sense elements as a function of different angular positions of said shaft, and output means controlled by said sense elements to provide a different one of said sets of output signals for each predetermined angular position of said shaft, said code disc having a plurality of discrete areas each of which represents a predetermined position of said shaft, and regions intermediate each pair of adjacent discrete areas, the conductors of each of said sense elements having an intermediate portion disposed on said code disc in a different one of said discrete areas and projections extending from a corresponding intermediate portion into intermediate regions adjacent the corresponding discrete area such that the intermediate regions between an adjacent pair of sense elements include the projections of conductors of a pair of adjacent sense elements and the photoresistive material exposed therebetween to permit such pair of adjacent sense elements to be energized concurrently whenever said source overlies the portions of sense elements disposed in a common intermediate region whereby first and second sets of output signals representing two angular positions of said shaft are provided over said output means.

2. A converter as set forth in claim 1 wherein said source means include means for directing light emitted by said phosphor towards the portion of the sense elements immediately underlying said source means.

3. In an analog-to-digital converter for providing a different set of output signals for each of a plurality of predetermined angular positions of a shaft, an encoder including a code disc having a surface covered with a photoresistive material and a plurality of pairs of conductors disposed on said photoresistive material the conductors of each pair extending generally over a radial portion of the code disc from the periphery toward the center of the code disc in a spaced relationship forming a gap therebetween thereby exposing a continuous narrow strip of the photoresistive material in said gap such that each conductor pair defines a separate sense element, each conductor of a given pair of conductors including a plurality of concentric arcuate conductor segments interconnected to form a continuous conductive path extending over said radial portion of said code disc to thereby maximize the length of the strip of photoresistive material exposed therebetween, each sense element having a first resistance when energized and a second resistance when unenergized, energizing means mounted for rotation by said shaft in an enabling relationship with said sense elements, said energizing means including radiant energy means for providing radiant energy for selectively energizing different ones of said sense elements as a function of different positions of said shaft, and output means controlled by said sense elements to provide a different one of said sets of output signals for each predetermined angular position of said shaft.

4. A converter as set forth in claim 3 wherein said code disc includes a separate sense element for each of said predetermined shaft positions, said energizing means being effective to energize one of said sense elements whenever said shaft is at one of said predetermined positions and to energize a pair of adjacent sense elements whenever said shaft is at a position intermediate a first and a second one of said predetermined positions.

5. A converter as set forth in claim 4 wherein said output means includes output switching means for each sense element operable to provide a first output signal whenever an associated sense element is energized and operable to provide a second output signal whenever an associated sense element is unenergized, one of said output switching means being operable to provide said first output signal whenever said shaft is at one of said predetermined positions and a pair of said output switching means being operable to provide said first output signal whenever said shaft is at a position intermediate a first and a second one of said predetermined positions.

6. A converter as set forth in claim 3 wherein said radiant energy means includes a radioactive element and a phosphor stimulated by radiations from said radioactive element to emit light.

7. In an analog-to-digital converter for providing a different set of output signals for each of a plurality of angular positions of a shaft, an encoder including a code disc having a surface covered with a photoresistive material and a plurality of pairs of conductors disposed on said photoresistive material and extending from the periphery of the code disc toward the center of the code disc in a spaced relationship forming a gap therebetween thereby exposing a continuous narrow strip of the photoresistive material in the gap such that each of said conductor pairs defines a separate photoresistive sense element, each of said sense elements providing a first resistance when energized and a second resistance when unergized, energizing means mounted for rotation by said shaft relative to said sense elements in a spaced overlying relationship with said sense elements and including source means and support means for locating said source means to define an enabling zone for said sense elements, said source means having a radiant energy means including radioactive element and phosphor stimulated by said radioactive element to emit light for selectively energizing different ones of said sense elements as a function of different angular positions of said shaft, and output means including a plurality of output circuits, one for each sense element, each output circuit providing a first output whenever an associated sense element is energized and a second output whenever an associated sense element is unenergized.

8. A converter as set forth in claim 7 wherein said support means comprises a hollow box-like structure of an opaque material having inner baffles defining a plurality of longitudinal U-shaped channels in said structure extending parallel to and opening toward said code disc, said radiant energy means being disposed at the bases of said channels.

9. A converter as set forth in claim 8 wherein said radiant energy means comprises a mixture of said radioactive element and said phosphor, coating the bases of said channels.

10. A converter as set forth in claim 7 wherein each of said output circuits includes switching means connected to an associated sense element, disabled when an associated sense element is energized to provide said first output signal and enabled when an associated sense element is unenergized to provide said second output signal.

11. A converter as set forth in claim 7 wherein said code disc includes 10 sense elements and said converter provides 20 different sets of output signals representing an unambiguous coding for 10 angular positions of said shaft.

12. A converter as set forth in claim 7 wherein said source means includes a transparent capsule having an inner surface coated with said phosphor and containing a radioactive element in gaseous form for stimulating said phosphor.

13. A converter as set forth in claim 12 wherein said support means include a pair of disc-shaped members mounted for rotation by said shaft and enclosing said capsule, one of said disc members having an aperture adjacent said code member to permit light emitted from said phosphor to be directed toward the portion of the code member adjacent said aperture as said support means are rotated by said shaft.

14. In an analog-to-digital converter for providing a different set of output signals for each of a plurality of predetermined angular positions of a shaft, an encoder including a code disc having a plurality of discrete areas, each of which corresponds to a different predetermined position of the shaft, and regions intermediate each pair of adjacent discrete areas, a plurality of photosensitive sense elements, including a separate photosensitive sense element for each of said predetermined positions disposed on said code disc in a corresponding discrete area, the sense element for each discrete area including photoresistive material disposed on a surface of said code disc in the discrete area and a pair of conductors including a first conductor disposed on a first portion of the photo-resistive material and extending radially from adjacent the center of the disc to the periphery of the disc over a portion of the discrete area and a second conductor having a conductor portion disposed on a second portion of said photoresistive material and extending radially from adjacent the center of the disc to the periphery of the disc in a spaced relationship with said first conductor, forming a gap therebetween thereby exposing a continuous narrow strip of photoresistive material in said gap, and source means, including a phosphor radioactively energized to emit light, mounted for rotation by said shaft relative to said sense elements for selectively energizing the sense element portions which are disposed adjacent thereto, and output means controlled by said sense elements to provide a different one of said sets of output signals for each predetermined angular position of said shaft.

15. A converter as set forth in claim 14 wherein the source means includes support means for locating said source to define an enabling zone for said sense elements to enable one of said sense elements whenever said shaft is at one of said predetermined positions and to enable an adjacent pair of said sense elements whenever said source is at a position intermediate each adjacent pair of said predetermined positions.

16. In an analog-to-digital converter for providing a different set of output signals for each of a plurality of predetermined angular positions of a shaft, an encoder including a code disc having a plurality of discrete areas, each of which corresponds to a different predetermined position of the shaft, and regions intermediate each pair of adjacent areas, said code disc having a photosensitive material disposed on a surface thereof and a plurality of pairs of conductors disposed on said photosensitive material to define a plurality of sense elements including a separate sense element corresponding to each of said discrete areas, a first conductor of each pair including a plurality of concentric arcuate segments interconnected to form a continuous conductive path extending over a portion of the corresponding discrete area from the periphery of the code disc toward the center of the code disc and having projections which extend into the intermediate regions adjacent the corresponding discrete area and a second conductor having a plurality of concentric arcuate segments interconnected to form a continuous conductive path extending over the discrete area and the intermediate regions adjacent the discrete area in a spaced relationship with the first conductor forming a gap therebetween thereby exposing a continuous narrow strip of photosensitive material in the gap, each sense element providing a first resistance when energized and a second resistance when unenergized, source means including a phosphor radioactively energized to emit light mounted for rotation by said shaft relative to said sense elements for selectively energizing the sense element portions which are disposed adjacent thereto, the segments of conductors of adjacent sense elements which extend into a common intermediate region overlapping one another to permit a pair of adjacent sense elements to be energized whenever said source means overlies a region intermediate a pair of adjacent sense elements.

* * * * *